United States Patent
Bosnyak et al.

(10) Patent No.: US 6,949,406 B2
(45) Date of Patent: *Sep. 27, 2005

(54) METHOD AND APPARATUS FOR OPTICALLY ALIGNING INTEGRATED CIRCUIT DEVICES

(75) Inventors: Robert J. Bosnyak, Tacoma, WA (US); Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/831,576

(22) Filed: Apr. 22, 2004

(65) Prior Publication Data

US 2004/0214357 A1 Oct. 28, 2004

Related U.S. Application Data

(60) Provisional application No. 60/465,316, filed on Apr. 24, 2003.

(51) Int. Cl.$^7$ ................................................ H01L 21/44
(52) U.S. Cl. ...................... 438/106; 438/108; 438/116; 438/401
(58) Field of Search ............................... 438/106, 107, 438/108, 116, 401; 257/797; 385/14

(56) References Cited

U.S. PATENT DOCUMENTS

| | | | |
|---|---|---|---|
| 6,272,271 B1 | 8/2001 | Wojnarowski et al. | 385/52 |
| 6,754,407 B2 * | 6/2004 | Chakravorty et al. | 385/14 |
| 2002/0105699 A1 | 8/2002 | Miracky et al. | 359/159 |
| 2002/0145185 A1 * | 10/2002 | Shrauger | 257/678 |
| 2002/0159719 A1 | 10/2002 | Ide et al. | 385/90 |
| 2003/0030869 A1 | 2/2003 | Kline et al. | 359/159 |
| 2004/0197046 A1 * | 10/2004 | Drost et al. | 385/14 |

FOREIGN PATENT DOCUMENTS

EP   1 207 599   9/2001   ........... H01S/5/183

OTHER PUBLICATIONS

Knight T.F Jr. et al: "Manufacturability of Capacitvely Coupled Multichip Modules" Proceedings of the Electronic Components and Technology Conference. Wahsington, May 1–4, 1994, New York, IEEE, US vol. CONF 44, May 1, 1994, ISBN 0–7803–0914–6.

* cited by examiner

Primary Examiner—Tuan H. Nguyen
(74) Attorney, Agent, or Firm—Park, Vaughan & Fleming LLP (57) ABSTRACT

One embodiment of the present invention provides a system that facilitates aligning a first semiconductor die with a second semiconductor die, wherein the first semiconductor die and the second semiconductor die are arranged active face to active face. Note that the active face contains circuitry for communicating between semiconductor dies. The system starts by generating light on an active face of the first semiconductor die. The system then collimates the light within the active face of the first semiconductor die to form a first beam of light which is projected onto the second semiconductor die. Next, the system receives the first beam of light on an active face of the second semiconductor die and determines a position of the first beam of light on the active face of the second semiconductor die. Finally, the system determines an alignment of the second semiconductor die relative to the first semiconductor die based on the determined position of the first beam of light.

22 Claims, 5 Drawing Sheets

METHOD AND APPARATUS FOR OPTICALLY ALIGNING INTEGRATED CIRCUIT DEVICES

RELATED APPLICATION

This application hereby claims priority under 35 U.S.C. 119 to U.S. Provisional Patent Application No. 60/465,316, filed on 24 Apr. 2003, entitled, "A Light Emission Receiving Alignment Technique," by inventors Robert J. Bosnyak and Robert J. Drost (Attorney Docket No. SUN-P9595PSP).

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to integrated circuit devices. More specifically, the present invention relates to a method and an apparatus for optically aligning integrated circuit devices.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem is beginning to create a bottleneck that continues to grow as semiconductor integration densities continue to increase.

Researchers have begun to investigate alternative techniques for communicating between semiconductor chips. One promising technique involves integrating arrays of capacitive transmitter plates and receiver plates onto semiconductor chips to facilitate inter-chip communication. If a first chip is situated face-to-face with a second chip so that transmitter plates on the first chip are capacitively coupled with receiver plates on the second chip, it becomes possible to transmit signals directly from the first chip to the second chip without having to route the signal through intervening signal lines within a printed circuit board. Other possible chip-to-chip communication techniques involve using optical fibers to couple light energy between chips, or using wire loops to couple magnetic fields between chips.

However, it is not a simple matter to align semiconductor chips with sufficient accuracy to facilitate chip-to chip communication. Conductive plates must align to couple electric fields. Optical fibers must align to couple light energy. Wire loops must align to couple electric fields. This alignment process must be extremely precise because these conductive plates, optical fibers and wire loops are generally a small fraction of the size of a semiconductor die, and in some cases can approach the smallest possible feature size that can be manufactured on a semiconductor substrate.

Hence, what is needed is a method and an apparatus for aligning semiconductor chips with sufficient accuracy to facilitate inter-chip communication.

SUMMARY

One embodiment of the present invention provides a system that facilitates aligning a first semiconductor die with a second semiconductor die, wherein the first semiconductor die and the second semiconductor die are arranged active face to active face. Note that the active face contains circuitry for communicating between semiconductor dies. The system starts by generating light on an active face of the first semiconductor die. The system then collimates the light within the active face of the first semiconductor die to form a first beam of light which is projected onto the second semiconductor die. Next, the system receives the first beam of light on an active face of the second semiconductor die and determines a position of the first beam of light on the active face of the second semiconductor die. Finally, the system determines an alignment of the second semiconductor die relative to the first semiconductor die based on the determined position of the first beam of light.

In a variation on this embodiment, the system generates light on the active face of the first semiconductor die and collimates the light into a second beam of light, wherein the second beam of light is at an angle to the first beam of light. Next, the system receives the second beam of light on the active face of the second semiconductor die, and determines a position of the second beam of light on the active face of the second semiconductor die. Finally, the system determines a distance between the first semiconductor die and the second semiconductor die by analyzing the position of the second beam of light on the active face of the second semiconductor die compared to the position of the first beam of light on the active face of the second semiconductor die.

In a variation on this embodiment, the light waves are generated by a Zener diode, a light emitting diode (LED), a vertical cavity surface emitting laser (VCSEL), or an avalanche breakdown PN diode.

In a variation on this embodiment, the first beam of light is collimated by shining the first beam of light through annuli created on metal layers on the first semiconductor die.

In a further variation, the shape of the annuli can include squares, circles, or octagons.

In a further variation, the angle of the first beam of light can be determined by creating the annuli in the metal layers such that a line through the centers of the annuli is set at a desired angle from the perpendicular axis of the active face of the first semiconductor die.

In a variation on this embodiment, the first beam of light is received on the active face of the second semiconductor die by a p-n junction photo-detector.

In a variation on this embodiment, the system further comprises a plurality of photo-detectors on the active face of the second semiconductor die for receiving the first beam of light.

In a further variation, the plurality of photo-detectors are arranged in a vector.

In a further variation, the plurality of photo-detectors are arranged in an array.

In a variation on this embodiment, the system further comprises generating light on the active face of the first semiconductor die and collimating the light into a third beam of light, wherein the third beam of light is not coplanar with the first and second beams of light. Next, the system receives the third beam of light on the active face of the second semiconductor die, and determines a position of the third beam of light on the active face of the second semiconductor die. Finally, the system determines an orientation of the first semiconductor die and the second semiconductor die in all six degrees of alignment by analyzing the positions of the first, second, and third beams of light on the active face of the second semiconductor die

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Semiconductor Dies

Figure 1:
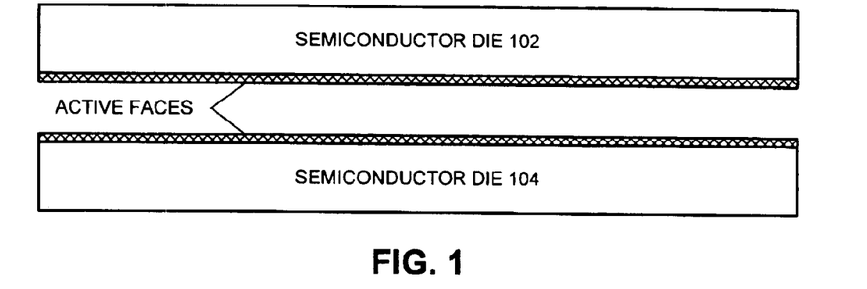
FIG. 1 illustrates two semiconductor dies in accordance with an embodiment of the present invention.

FIG. 1 illustrates two semiconductor dies in accordance with an embodiment of the present invention. One embodiment of the present invention provides a mechanism that aligns semiconductor die 102 to semiconductor die 104 to facilitate inter-chip communication between semiconductor die 102 and semiconductor die 104. As is illustrated in FIG. 1, semiconductor dies 102 and 104 are arranged active-face to active-face so that communication features on semiconductor dies 102 and 104 are aligned with each other. In one embodiment of the present invention, the alignment mechanism is optical. Hence, during the alignment process, light is emitted from semiconductor die 102 and received by semiconductor die 104.

In one embodiment of the present invention, two forms of emitting and receiving arrays are used. A first form, uses light collimated perpendicular to the die surface to detect the X-Y position. A second form uses light aligned at an angle (which is compensated for dissimilar refractive indexes) to detect the separation (Z) between the dies. This technique improves upon visual alignment and prior electrical alignment techniques because the expected resolution is only limited by the wavelength of the emitted light and the ability to collimate that light. Moreover, this technique allows large chip separation and uses less die area than existing alignment techniques.

Metal Layer Arrangements

Figure 2:
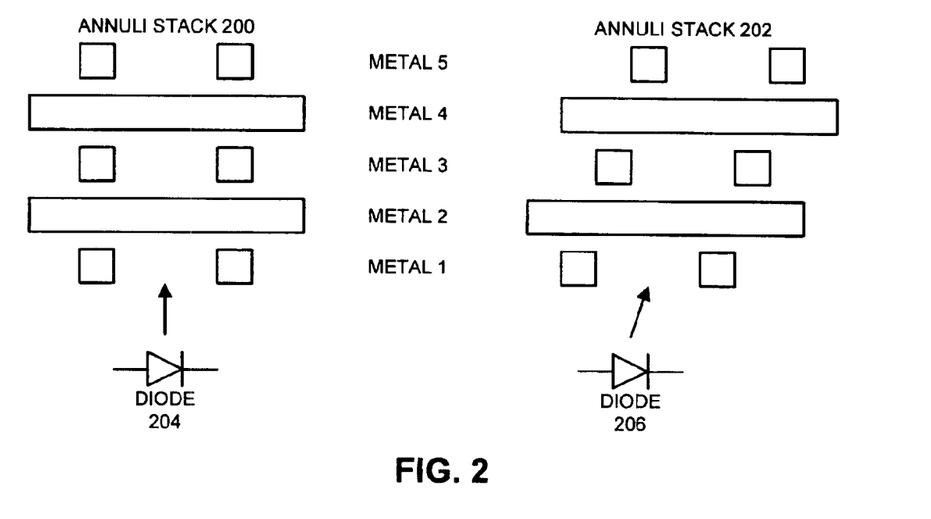
FIG. 2 illustrates two possible metal layer arrangements for collimating light in accordance with an embodiment of the present invention.

FIG. 2 illustrates two possible metal layer arrangements for collimating light in accordance with an embodiment of the present invention. Note that in FIG. 1, semiconductor die 102 contains a sparse array of light emitters, and semiconductor die 104 contains a larger array of light receivers. Moreover, semiconductor die 102 uses patterns in the metal layers to collimate light. For example, annuli stack 200 comprises vertically stacked annuli in the metal layers on semiconductor die 102. Note that annuli stack 200 collimates light generated by diode 204 at right angles to the surface of semiconductor die 102. The receiving array on semiconductor die 104 detects the x-y position of the emitter array by scanning the state of the light intensity over the larger array.

Another set of emitting and receiving arrays sets the collimation at an angle so that the emitters and receivers yield the separation distance Z between the semiconductor dies. The light can be angled by offsetting the centers of the annuli in the metal layers. For example, in FIG. 2 light emitted from diode 206 is collimated by passing it through annuli stack 202, which is arranged at an angle from the perpendicular axis of semiconductor die 102. Furthermore, the angle of collimation from the perpendicular axis is chosen to compensate for the change in the index of refraction between the dielectric of the dies and the interstitial medium between the dies. Note that the angle between the dies is derived from two X-Y positions located at different points on the receiving die.

The emitters can be one of many possible light sources. Zener diodes, light emitting diodes (LED), vertical cavity surface emitting laser (VCSEL), avalanche breakdown PN diodes, etc. Furthermore, these sources can be coherent or non-coherent. Note that VCSELs yield non-coherent light at currents less than the lasing current. One possible emitter for standard CMOS technology is avalanched diode light emission because no extra processing step are required to make this emitter. A simple photo-detector receiver, such as a p-n junction photo-detector, is adequate for detecting position.

Metal Layer Structures

Figure 3A:
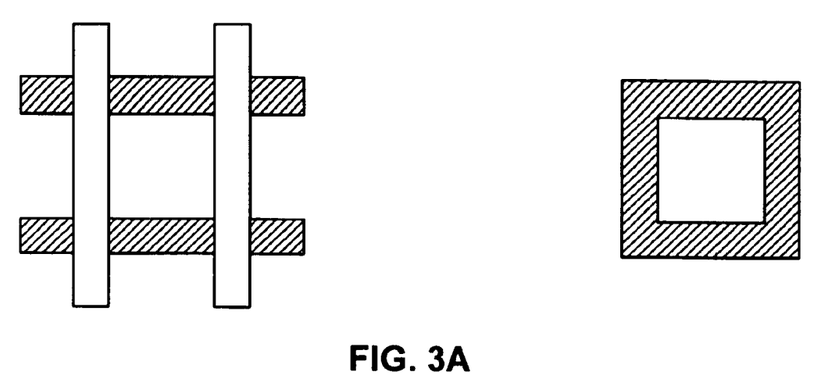
FIG. 3A illustrates metal layer annuli arranged to produce a 90 degree beam of light in accordance with an embodiment of the present invention.

FIG. 3A illustrates metal layer annuli arranged to produce a 90-degree beam of light in accordance with an embodiment of the present invention. Stacked apertures in the metal layers collimate the generated light. More specifically, the aperture can be formed by annuli stacked with their centers set at the desired angle from the perpendicular axis of the die surface. In another example, each metal layer may have two metal strips separated by the minimum metal separation of 0.6 microns for a 0.4 micron technology. In each alternate metal layer, strips are aligned at right angles to each other. The stacked aperture will be 0.6 microns or wavelength of orange light. An array of 64 receivers (8 by 8) will take up about 100 square microns for a 0.4 micron technology. Note that an array of one emitter is sufficient to determine the local X-Y position. However, an array of a few of emitters can be used to implement a vernier scheme for interpolating the X-Y position. More advanced technology will allow even further resolution in a smaller space.

Figure 3B:
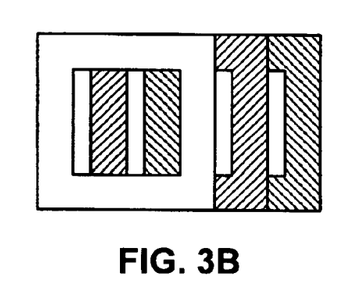
FIG. 3B illustrates metal layer annuli arranged to produce a 45 degree beam of light in accordance with an embodiment of the present invention.
Figure 3C:
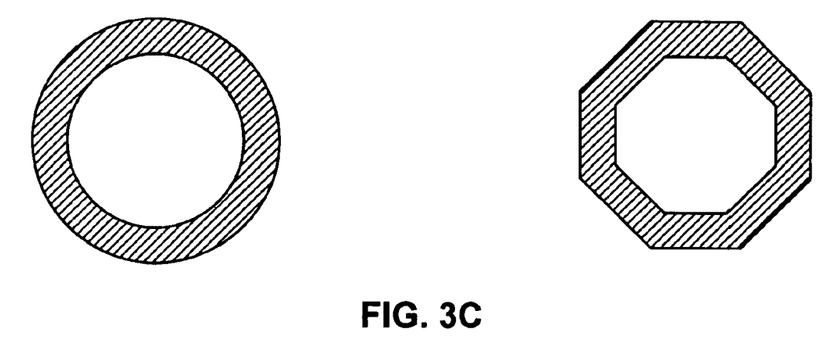
FIG. 3C illustrates additional annuli shapes in accordance with an embodiment of the present invention.

FIG. 3B illustrates metal layer annuli arranged to produce a 45-degree beam of light in accordance with an embodiment of the present invention. FIG. 3C illustrates additional annuli shapes in accordance with an embodiment of the present invention.

The simplest receivers in a CMOS technology are reverse-biased diodes. Light absorbed in these diodes creates electron-hole pairs in the semiconductor space charge region that produces a detectable current. This process is slow compared to normal switching speeds of CMOS circuitry but nevertheless is detectable in a time frame allowing detection of the position and re-alignment between motion and detection phases. The circuit may additionally retain state by charge storage or may have a memory element associated with each receiver site. Scanning the state of the receivers yields the relative position of the dies.

Compensating for Refraction

Figure 4:
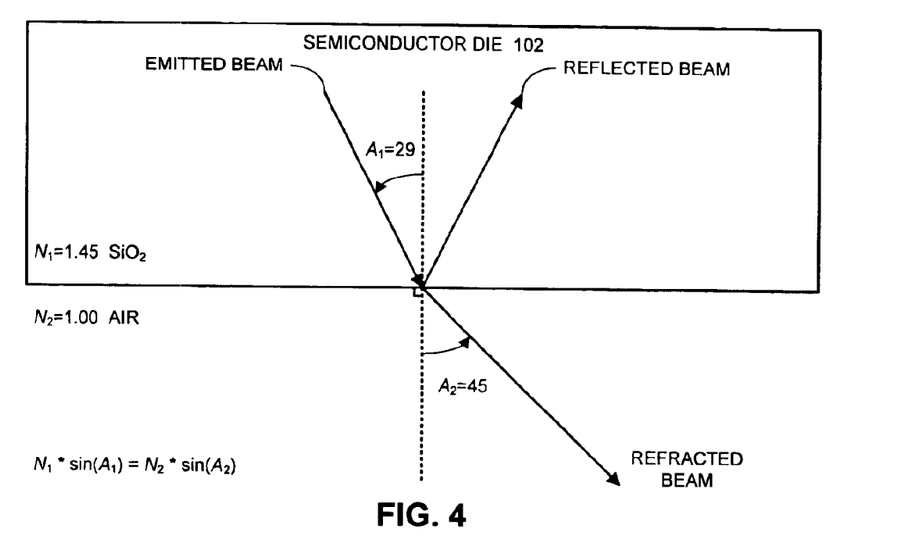
FIG. 4 illustrates the process of compensating for refraction in accordance with an embodiment of the present invention.

FIG. 4 illustrates compensating for refraction in accordance with an embodiment of the present invention. For separation measurements the index of refraction must be considered. The refractive light passing from one media to another is describe by the following formula:

$$N_1 \cdot \sin(A_1) = N_2 \cdot \sin(A_2)$$

where $N_1$, and $N_2$ are the indices of refraction for each media and $A_1$ and $A_2$ are the angles of the light beams. When light passes through a dense medium to a media with different optical density, the light is refracted. Hence, light passing through the layers of $SiO_2$ to air is refracted. For a set of two dies separated by an air-gap the differences of refracting between $SiO_2$/air and air/$SiO_2$ requires a collimated angle of 29 degrees from the perpendicular because the ratio of $N_2/N_1$ is about 0.66. For a set of dies separated by oil, as currently used in recent experiments, the $SiO_2$/oil collimating angle can be set at 45 degrees because the index of refraction for $SiO_2$ is 1.47 and oil is about 1.46; a lucky circumstance.

Offset Detection Circuit

Figure 5:
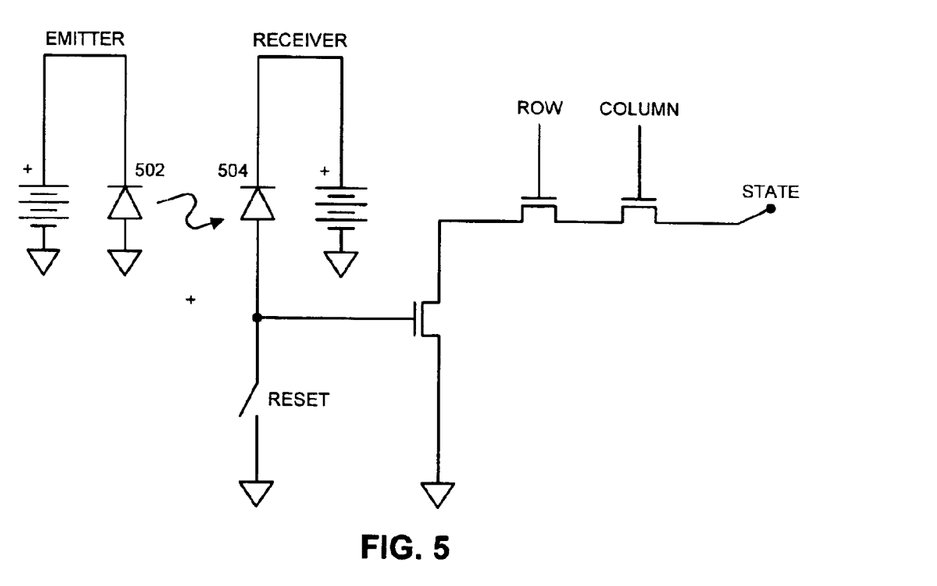
FIG. 5 presents a circuit diagram illustrating the offset detection system in accordance with an embodiment of the present invention.

FIG. 5 presents a circuit diagram for an offset detection system in accordance with an embodiment of the present invention. Light generated by emitter diode 502 on semiconductor die 102 is received by photo-detector 504 on semiconductor die 104. The output of the receiving diode is scanned by row and column using the row and column pass transistors illustrated in FIG. 5 to determine the location of the received light on semiconductor die 104. Techniques for scanning row and column are well-known in the art and will not be discussed further herein.

Photo-Detector Arrays

Figure 6:
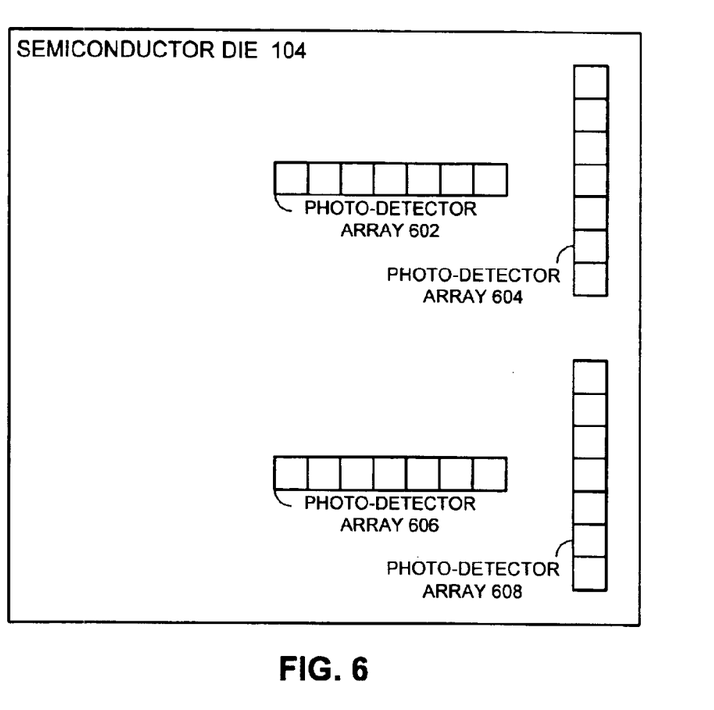
FIG. 6 illustrates photo-detector arrays in accordance with an embodiment of the present invention.

FIG. 6 illustrates photo-detector arrays 602–606 in accordance with an embodiment of the present invention. As is illustrated in FIG. 6, photo-detector arrays 602–606 on semiconductor die 104 are one-dimensional arrays, wherein each array receives a beam of light generated by a corresponding light source on semiconductor die 102. Note that smaller arrays require semiconductor dies 102 and 104 be close to optimal alignment before beams of light generated on semiconductor 102 are detected on semiconductor 104. Whereas, larger arrays allow detection with coarser alignments. However, larger arrays also consume more area on the receiving die.

Six Degrees of Alignment

Figure 7:
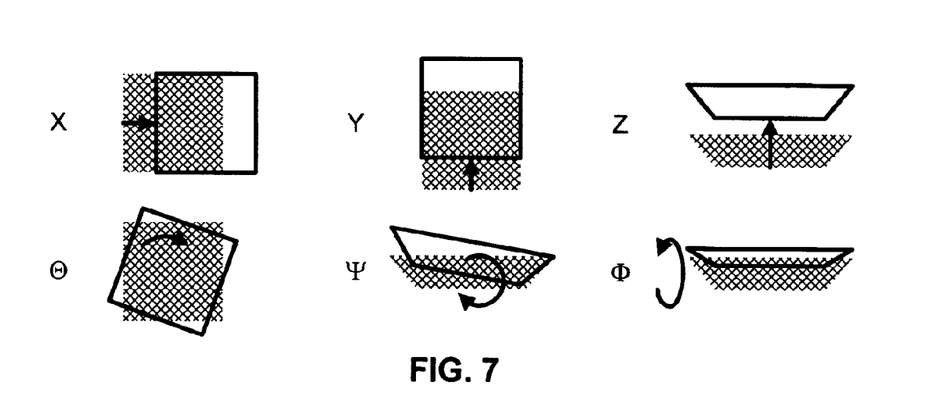
FIG. 7 illustrates six degrees of alignment in accordance with an embodiment of the present invention.

FIG. 7 illustrates the possible six degrees of alignment between semiconductor dies 102 and 104. In one embodiment of the present invention, light beam detection and subsequent analysis allows x, y, z, θ, Ψ, and Φ alignments to be determined.

Process of Aligning Semiconductor Dies

Figure 8:
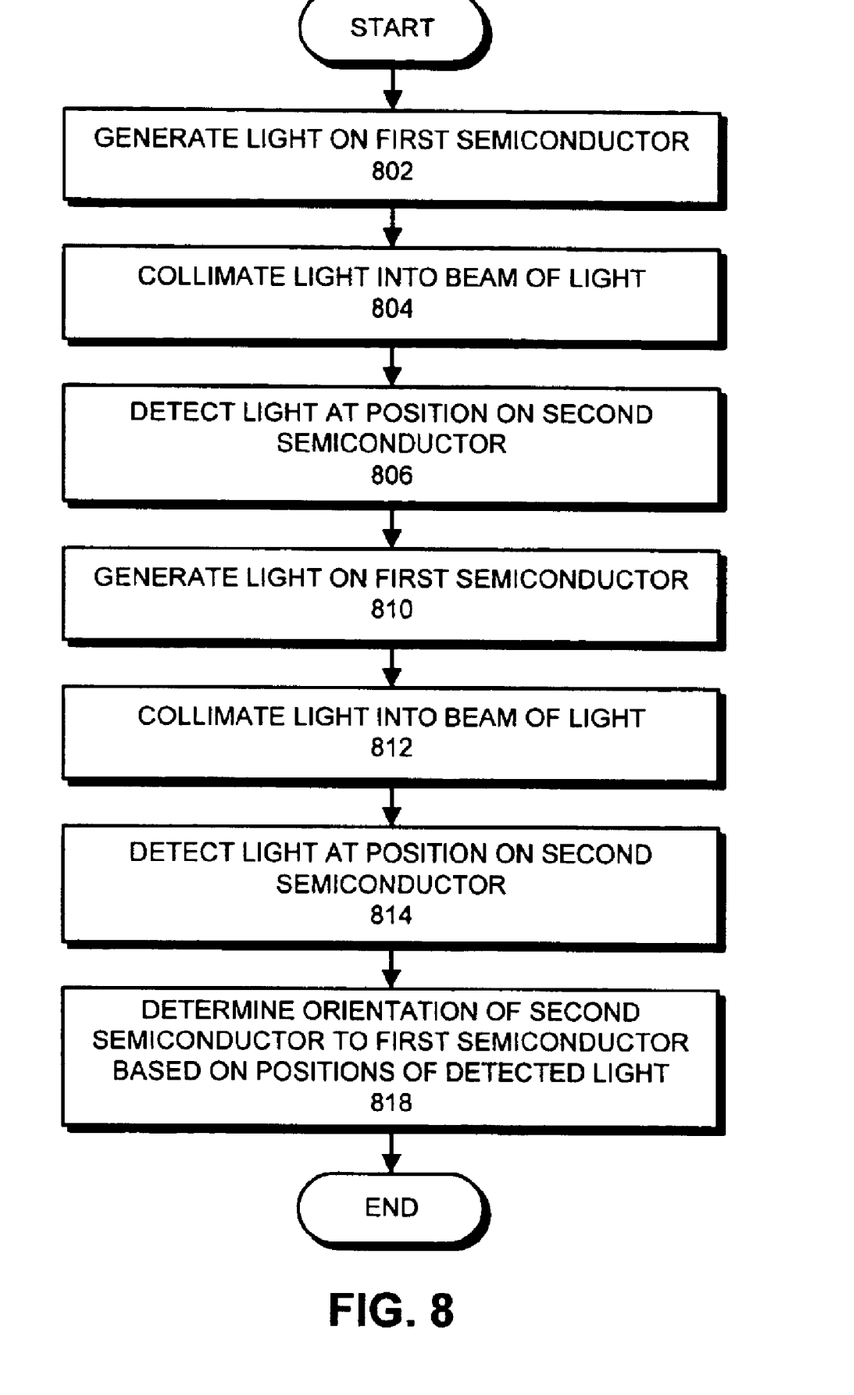
FIG. 8 presents a flowchart illustrating the process of aligning two semiconductor dies in accordance with an embodiment of the present invention.

FIG. 8 presents a flowchart illustrating the process of aligning two semiconductor dies in accordance with an embodiment of the present invention. The system starts when light is generated on semiconductor 102 (step 802). This light is collimated via structures in the metal layers on semiconductor 102 into a first beam of light which is projected onto semiconductor die 104 (step 804). Next, the incident beam of light is detected at a specific position of semiconductor 104. At the same time, the system generates light from another light source on semiconductor 102 (step 810) and collimates the light via structures in the metal layers on semiconductor 102 into a second beam of light with an angle different than the first beam of light (step 812). Next, the second beam of light is detected at a specific position of semiconductor 104 (step 814). Finally, the system determines the orientation of semiconductor 104 to semiconductor 102 based on the detected positions of the first and second beams.

Note that with three or more beams of light, it is possible to determine all six x, y, θ, z, Ψ, and Φ alignments.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for aligning a first semiconductor die with a second semiconductor die, wherein the first semiconductor die and the second semiconductor die are arranged active face to active face, wherein an active face contains circuitry for communicating between semiconductor dies, the method comprising;

generating light on an active face of the first semiconductor die;

collimating the light within the active face of the first semiconductor die into a first beam of light;

receiving the first beam of light on an active face of the second semiconductor die;

determining a position of the first beam of light on the active face of the second semiconductor die; and determining an alignment of the second semiconductor die to the first semiconductor die based on the determined position.

2. The method of claim 1, further comprising:

generating light on the active face of the first semiconductor die;

collimating the light into a second beam of light, wherein the second beam of light is at an angle to the first beam of light;

receiving the second beam of light on the active face of the second semiconductor die;

determining a position of the second beam of light on the active face of the second semiconductor die; and determining a distance between the first semiconductor die and the second semiconductor die by analyzing the position of the second beam of light on the active face of the second semiconductor die compared to the position of the first beam of light on the active face of the second semiconductor die.

3. The method of claim 2, further comprising:

generating light on the active face of the first semiconductor die;

collimating the light into a third beam of light, wherein the third beam of light is not coplanar with the first and second beams of light;

receiving the third beam of light on the active face of the second semiconductor die;

determining a position of the third beam of light on the active face of the second semiconductor die; and determining an orientation of the first semiconductor die and the second semiconductor die in all six degrees of alignment by analyzing the positions of the first, second, and third beams of light on the active face of the second semiconductor die.

4. The method of claim 1, wherein the light waves are generated by one of:

a Zener diode;

a light emitting diode (LED);

a vertical cavity surface emitting laser (VCSEL); and an avalanche breakdown PN diode.

5. The method of claim 1, wherein the first beam of light is collimated by shining the first beam of light through annuli created on metal layers on the first semiconductor die.

6. The method of claim 5, wherein the shape of the annuli can include:

squares;

circles; and octagons.

7. The method of claim 5, wherein the angle of the first beam of light can be determined by creating the annuli in the metal layers such that a line through the centers of the annuli is set at a desired angle from the perpendicular axis of the active face of the first semiconductor die.

8. The method of claim 1, wherein the first beam of light is received on the active face of the second semiconductor die by a p-n junction photo-detector.

9. The method of claim 1, further comprising a plurality of photo-detectors on the active face of the second semiconductor die for receiving the first beam of light.

10. The method of claim 9, wherein the plurality of photo-detectors are arranged in a vector.

11. The method of claim 9, wherein the plurality of photo-detectors are arranged in an array.

12. An apparatus for aligning a first semiconductor die with a second semiconductor die, wherein the first semiconductor die and the second semiconductor die are arranged active face to active face, wherein an active face contains circuitry for communicating between semiconductor dies, the method comprising;

a light generating mechanism configured to generate light on an active face of the first semiconductor die;

a collimating mechanism configured to collimate the light within the active face of the first semiconductor die into a first beam of light;

a receiving mechanism configured to receive the first beam of light on an active face of the second semiconductor die;

a determination mechanism configured to determine a position of the first beam of light on the active face of the second semiconductor die; and an alignment mechanism configured to determine an alignment of the second semiconductor die to the first semiconductor die based on the determined position.

13. The apparatus of claim 12, further comprising:

a second light generating mechanism configured to generate light on the active face of the first semiconductor die;

a second collimating mechanism configured to collimate the light into a second beam of light, wherein the second beam of light is at an angle to the first beam of light;

a second receiving mechanism configured to receive the second beam of light on the active face of the second semiconductor die; and a second determining mechanism configured to determine a position of the second beam of light on the active face of the second semiconductor die;

wherein the alignment mechanism is further configured to determine a distance between the first semiconductor die and the second semiconductor die by analyzing the position of the second beam of light on the active face of the second semiconductor die compared to the position of the first beam of light on the active face of the second semiconductor die.

14. The apparatus of claim 13, further comprising:

a third light generating mechanism configured to generate light on the active face of the first semiconductor die;

a third collimating mechanism configured to collimate the light into a third beam of light, wherein the third beam of light is not coplanar with the first and second beams of light;

a third receiving mechanism configured to receive the third beam of light on the active face of the second semiconductor die; and a third determining mechanism configured to determine a position of the third beam of light on the active face of the second semiconductor die;

wherein the alignment mechanism is further configured to determine an orientation of the first semiconductor die and the second semiconductor die in all six degrees of alignment by analyzing the positions of the first, second, and third beams of light on the active face of the second semiconductor die.

15. The apparatus of claim 12, wherein the light generating mechanism comprises one of:

a Zener diode;

a light emitting diode (LED);

a vertical cavity surface emitting laser (VCSEL); and an avalanche breakdown PN diode.

16. The apparatus of claim 12, wherein the collimating mechanism is further configured to collimate the first beam of light by shining the first beam of light through annuli created on metal layers on the first semiconductor die.

17. The apparatus of claim 16, wherein the shape of the annuli can include:

squares;

circles; and octagons.

18. The apparatus of claim 16, wherein the angle of the first beam of light can be determined by creating the annuli in the metal layers such that a line through the centers of the annuli is set at a desired angle from the perpendicular axis of the active face of the first semiconductor die.

19. The apparatus of claim 12, wherein the first beam of light is received on the active face of the second semiconductor die by a p-n junction photo-detector.

20. The apparatus of claim 12, wherein the receiving mechanism is further configured to receiving the first beam of light on a plurality of photo-detectors on the active face of the second semiconductor die.

21. The apparatus of claim 20, wherein the plurality of photo-detectors are arranged in a vector.

22. The apparatus of claim 20, wherein the plurality of photo-detectors are arranged in an array.

* * * * *